United States Patent
Chen et al.

(10) Patent No.: US 9,375,821 B2
(45) Date of Patent: Jun. 28, 2016

(54) ELECTRICALLY ASSISTED CHEMICAL-MECHANICAL PLANARIZATION (EACMP) SYSTEM AND METHOD THEREOF

(75) Inventors: Chao-Chang Chen, Taipei (TW); Chi Hsiang Hsieh, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 279 days.

(21) Appl. No.: 13/481,837

(22) Filed: May 27, 2012

(65) Prior Publication Data

US 2013/0137263 A1 May 30, 2013

(30) Foreign Application Priority Data

Nov. 24, 2011 (TW) .............................. 100143192 A

(51) Int. Cl.
*C23F 1/00* (2006.01)
*B24B 37/04* (2012.01)
*B23H 5/08* (2006.01)
*H01L 21/321* (2006.01)
*B24B 37/20* (2012.01)

(52) U.S. Cl.
CPC ............... *B24B 37/046* (2013.01); *B23H 5/08* (2013.01); *B24B 37/20* (2013.01); *H01L 21/32125* (2013.01)

(58) Field of Classification Search
CPC ........ B23H 5/08; B24B 37/046; B24B 37/04; H01L 21/32125; H01L 21/3212; H01L 21/306
USPC ............. 156/345.11, 345.12, 345.13, 345.14, 156/345.28; 205/640, 643; 118/620, 628; 438/692
See application file for complete search history.

(56) References Cited

U.S. PATENT DOCUMENTS

| | | | |
|---|---|---|---|
| 6,257,953 B1 * | 7/2001 | Gitis et al. .................... 451/5 |
| 6,413,388 B1 | 7/2002 | Uzoh et al. | |
| 7,297,239 B2 * | 11/2007 | Emesh ................. B23H 5/08 |
| | | | 204/224 M |
| 2004/0163950 A1 * | 8/2004 | Emesh ................. B23H 3/00 |
| | | | 204/297.06 |
| 2005/0133379 A1 * | 6/2005 | Basol .................... C25F 7/00 |
| | | | 205/652 |
| 2005/0173260 A1 | 8/2005 | Basol et al. | |
| 2008/0188162 A1 * | 8/2008 | Kobata et al. ................. 451/8 |
| 2011/0053465 A1 * | 3/2011 | Tsai ................... B24B 37/046 |
| | | | 451/41 |

FOREIGN PATENT DOCUMENTS

TW 200538233 A 12/2005

OTHER PUBLICATIONS

Development of an Electrical Assisted Chemical Mechanical Polishing (EACMP) for Cu Film Planarization.

* cited by examiner

*Primary Examiner* — Lan Vinh

(57) ABSTRACT

A novel polishing pad is described. The polishing pad includes a base plate, a main polishing body, a plurality of metal bottom portions, a positive electrode conductive wire and a negative electrode conductive wire. The main polishing body made from a non-conductive material and disposed on the base plate includes a plurality of cavities thereon. The metal bottom portions are disposed in the cavities with each of the cavities having one of the metal bottom portions therein. The positive electrode conductive wire electrically is connected to a positive electrode of a power supply. The negative electrode conductive wire electrically is connected to a negative electrode of the power supply. The positive electrode conductive wire and the negative electrode conductive wire alternatively pass through the base plate and connect to the metal bottom portions respectively.

18 Claims, 10 Drawing Sheets

ELECTRICALLY ASSISTED CHEMICAL-MECHANICAL PLANARIZATION (EACMP) SYSTEM AND METHOD THEREOF

This invention claims the priority of Taiwan Patent Application No. 100143192, filed on Nov. 24, 2011. This invention is partly disclosed in a thesis, "Development of an Electrical Assisted Chemical Mechanical Polishing (EACMP) for Cu Film Planarization," published on May 27, 2011.

FIELD OF THE INVENTION

The present invention relates to a novel polishing pad structure, an electrically assisted chemical-mechanical planarization (EACMP) system using the polishing pad and an EACMP method thereof, and more particularly to a polishing pad structure by electrically and alternatively, e.g. interlacedly, connecting the positive and negative electrodes of the power supply to the metal bottom portions respectively in the cavities on the polishing pad to produce the electro-osmosis and electrochemical effects, which reduces residual stress and defects, increase removal rate and maintains the polishing particles uniform.

BACKGROUND OF THE INVENTION

While manufacturing integrated circuits (ICs), a deposition step is usually performed on the semiconductor wafer and a conductive layer, a semi-conductive layer and a dielectric layer are removed from the deposition layer. Basically, after a material is deposited on the semiconductor wafer, the surface of the semiconductor wafer become uneven and thus a planarization step need to be exerted on the surface of the semiconductor wafer. The planarization step is used to remove the undesired topography structures, such as rough surface, scratches, polluted portions and surface defects.

A Chemical Mechanical Polishing (CMP) is a planarization technique for the semiconductor wafer where the semiconductor wafer is located in the CMP device and contacts the polishing pad. The polishing slurry with chemical-base feature is introduced to the gap between wafer and the polishing pad so that the chemical and mechanical functions exerted between the slurry and the polishing pad for planarizing and polishing the wafer surface.

Even if the CMP technique is widely used in semiconductor process for a global planarization, however, it is necessary to overcome the issues including residual stresses, scratches and the clean step followed by planarization step while the CMP process is employed in the multiple layer structure with the copper and low-k materials.

As shown in FIG. 11, it is a schematic view of cavities 911 within the copper conductive wire 91 by using a conventional planarization structure after performing a chemical-mechanical polishing method on a wafer 90. Further, there are cavities 911 in the oxide layer 92 between the copper conductive wire 91 and the wafer 90, resulting in the defects of the wafer. Consequently, there is a need to develop a novel system and method to solve the aforementioned problems.

SUMMARY OF THE INVENTION

The objective of the present invention is to provide a novel polishing pad structure including a base plate; a main polishing body, made from a non-conductive material and disposed on the base plate, with a plurality of cavities thereon; a plurality of metal bottom portions disposed in the cavities with each of the cavities having one of the metal bottom portions therein; a positive electrode conductive wire electrically connected to a positive electrode of a power supply; and a negative electrode conductive wire electrically connected to a negative electrode of the power supply; wherein the positive electrode conductive wire and the negative electrode conductive wire alternatively, e.g. interlacedly, pass through the base plate and connect to the metal bottom portions respectively. The material of metal bottom portions is preferably copper material.

In the polishing pad, a plurality of narrow slots are disposed between the adjacent cavities for allowing electrical connection and fluid communication between the adjacent cavities. A width of each of the narrow slots is less than a width of each of metal bottom portions. An edge position of a metal bottom portion does not contact the main polishing body.

In another embodiment, the polishing pad further includes a plurality of grooves wherein each of grooves comprises at least two of the metal bottom portions. Additionally, the cavities on the polishing pad are substantially arranged in form of a plurality of cavity rows substantially parallel to an extending direction of the grooves, and the cavity rows are parallel to and interlaced with the grooves on the polishing pad.

In another embodiment, a plurality of trenches are disposed between the cavities and the grooves for allowing electrical connection and fluid communication between the adjacent cavities and the grooves. A width of each of the trenches is less than a width of each of metal bottom portions.

The present invention further provides an electrically assisted chemical-mechanical planarization (EACMP) system and method thereof. The EACMP system and method can effectively reduce the residual stresses and defects, increase the removal rate, and maintain the sizes of polishing particles to solve the problem of residual stresses and defects in the wafer of the prior art.

The EACMP system includes a main base having a workpiece retaining portion and a platform, wherein a vertical distance between the workpiece retaining portion and the platform can be adjusted, and the platform has a driving member for driving the platform to be rotated; a polishing pad disposed on the platform; a power supply having the positive electrode and the negative electrode, wherein the positive electrode is electrically connected to the positive electrode conductive wire of the polishing pad and the negative electrode is electrically connected to the negative electrode conductive wire of the polishing pad; and a polishing slurry supply unit, for distributing a polishing slurry to the polishing pad.

The EACMP method further includes the following steps:

(1) performing a preparing step by using an electrically assisted chemical-mechanical planarization (EACMP) system;

(2) producing a step of an electro-osmosis effect and an electrochemical effect wherein a predetermined processing layer of a predetermined processing workpiece contacts a main polishing body of the polishing pad for dipping the predetermined processing layer in the polishing slurry, the electro-osmosis and electrochemical effects are induced after providing the power supply for circulating the polishing slurry around the main polishing body for removing partial material of the predetermined processing layer;

(3) performing a passivating step, wherein when the predetermined processing layer is removed by electrochemical effect, a surface of the predetermined processing layer forms a passivation layer;

(4) performing a mechanical polishing step, wherein the polishing pad is rotated to drive a circulation of the polishing slurry for mechanically polishing the predetermined processing layer of the formed passivation layer; and (5) performing a complete step, wherein an electro-osmosis and electrochemical effects of the step (2), the passivating step of step (3) and the mechanical polishing step of step (4) are repeated for planarizing the surface of the predetermined processing layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
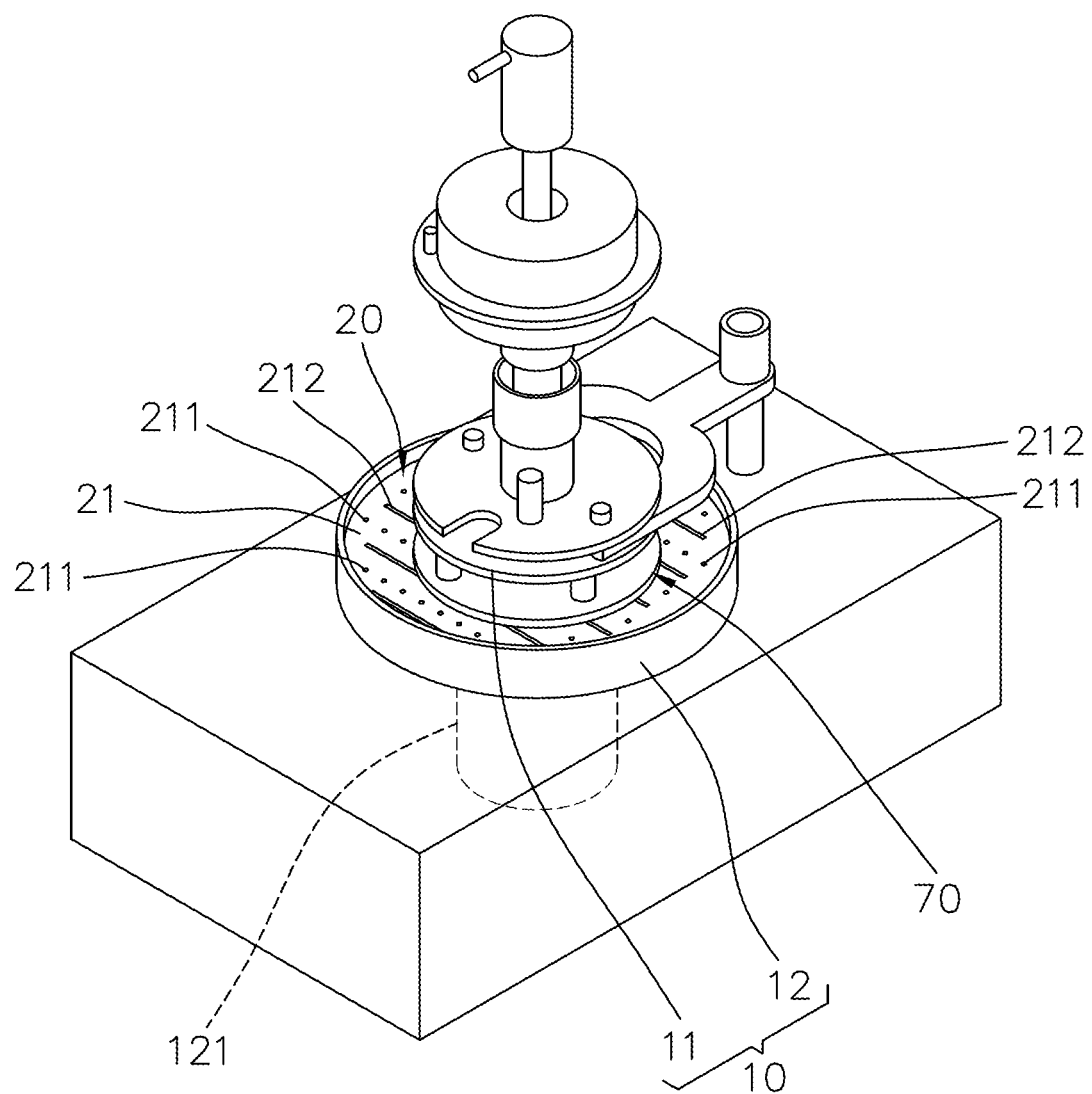
FIG. 1 is a schematic view of an EACMP system according to one embodiment of the present invention.

Hereinafter, exemplary embodiments of the present specification will be described in detail with reference to the illustrative drawings. It is to be noted that in giving reference numerals to components of each of the accompanying drawings, like reference numerals refer to like elements even though the like components are shown in different drawings.

Further, in describing exemplary embodiments of the present invention, well-known functions or constructions will not be described in detail since they may unnecessarily obscure the understanding of the present invention.

Please refer to FIG. 1 through FIG. 3B. The present invention is a polishing pad employed in the EACMP system shown in FIG. 1. As shown in FIG. 2A through FIG. 2C, the polishing pad includes a main polishing body 21, base plate 22 and a plurality of metal bottom portions 23. The main polishing body 21 made from a non-conductive material and disposed on the base plate 22 includes a plurality of cavities 211 thereon and a plurality of grooves 212. In one case, the base plate 22 is made from conductive material. The metal bottom portions 23 are disposed in the cavities 211 with each of the cavities 211 having one of the metal bottom portions 23 therein. Each of grooves 212 includes at least two of the metal bottom portions 23.

Figure 2A:
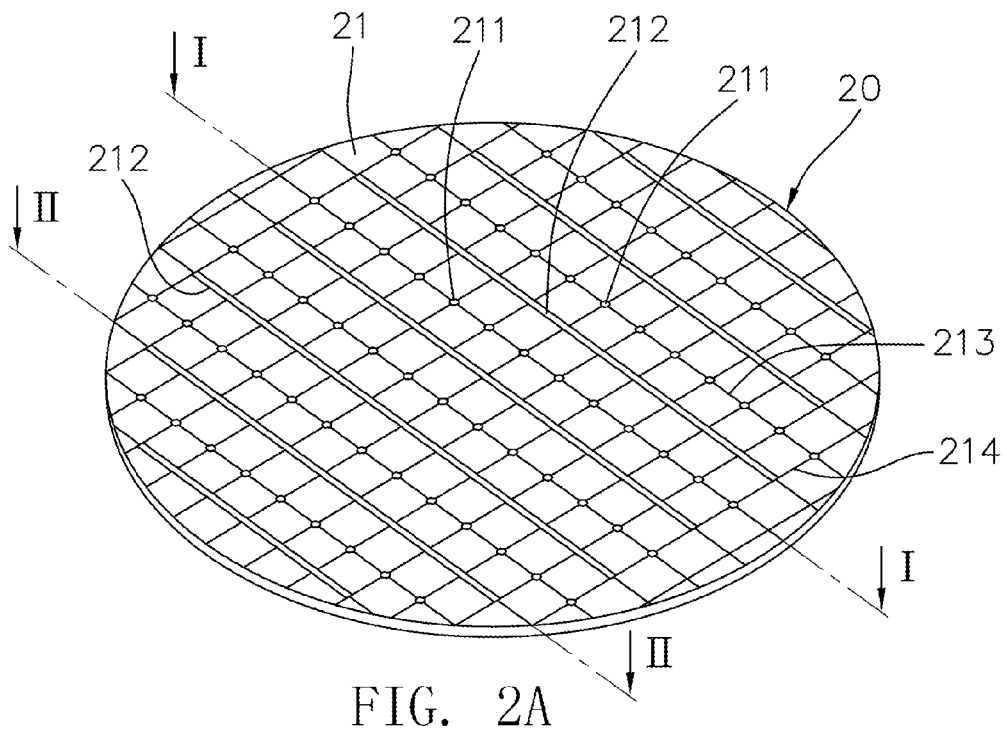
FIG. 2A is a schematic view of a polishing pad according to one embodiment of the present invention.
Figure 2B:
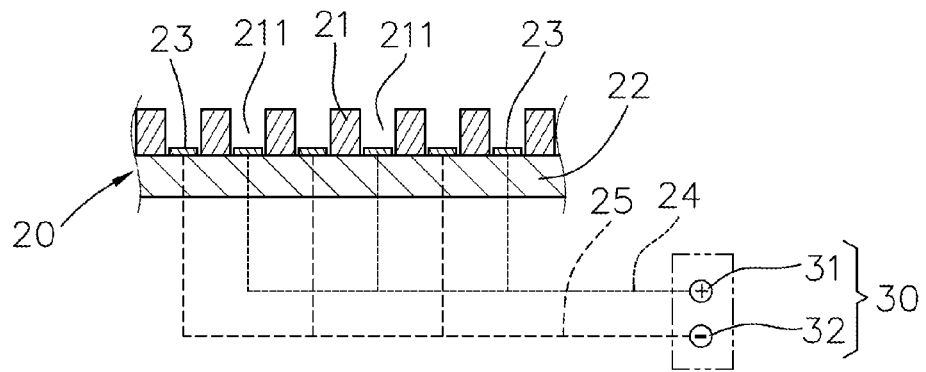
FIG. 2B is a schematic cross-sectional view along the I-I line shown in FIG. 2A according to one embodiment of the present invention.
Figure 9:
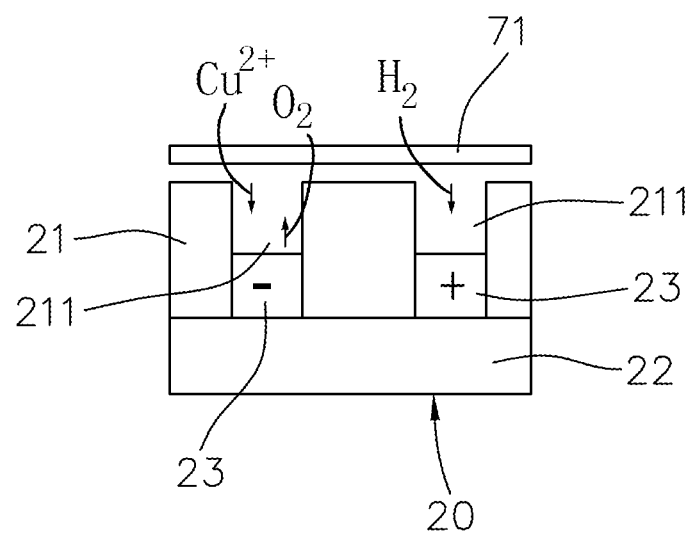
FIG. 9 is a schematic view of electrically assisted reaction process according to one embodiment of the present invention.

FIG. 2B is a schematic cross-sectional view of the polishing pad 20 along the I-I line shown in FIG. 2A according to one embodiment of the present invention. As shown in FIG. 2B, the cavities 211 form a plurality of electrochemical reaction spaces by the main polishing body 21. The metal bottom portions 23 in the cavities 211 further interlacedly connect to the positive electrode 31 and negative electrode 32, respectively, of the power supply of the EACMP system by the positive electrode conductive wire 24 and negative electrode conductive wire 25. After the polishing slurry is provided for the polishing pad 20, the electrochemical reaction spaces with positive and negative electrodes are formed to improve the electrochemical polishing effect of the polishing pad 20, as shown in FIG. 9. In FIG. 9, the copper ions ($Cu^{2+}$) of the predetermined processing layer 71 are ionized and enter the polishing slurry 40 for increasing the removal rate of the predetermined processing layer 71 after the current flow into the polishing pad 20 to form the electrochemical reaction spaces with positive and negative electrodes.

Figure 3A:
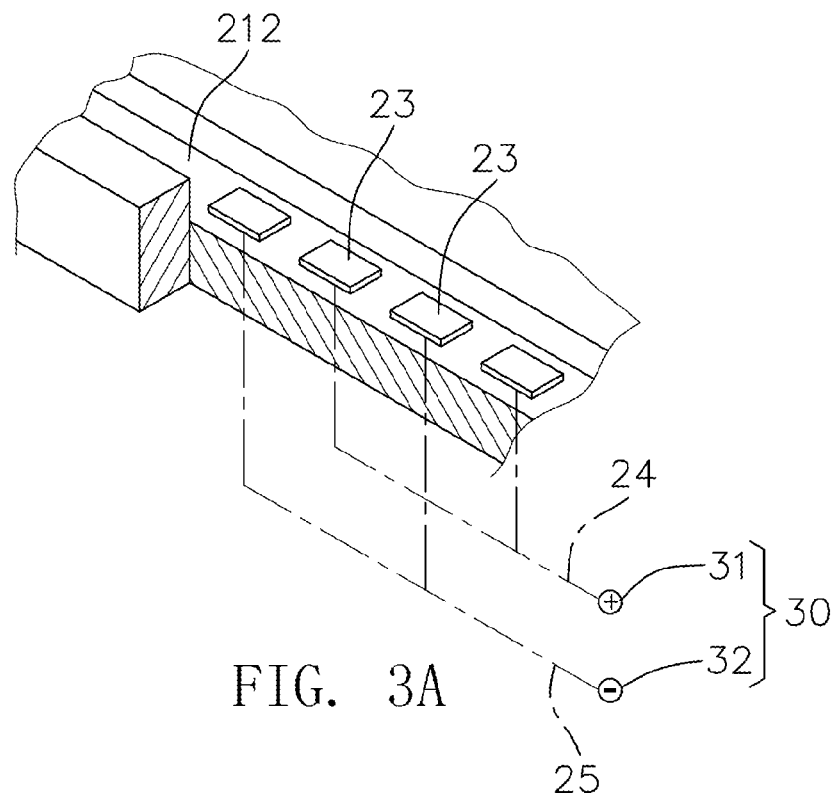
FIG. 3A is a schematic partial view of a groove according to one embodiment of the present invention.
Figure 3B:
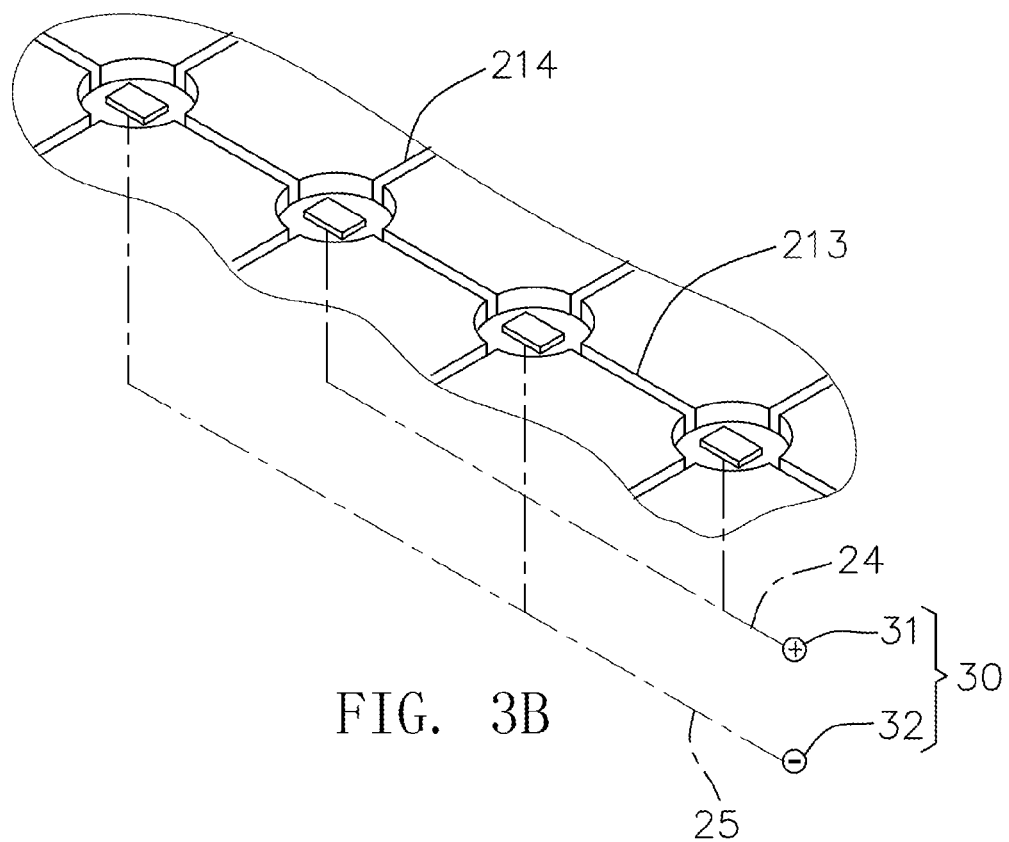
FIG. 3B is a schematic partial view of cavity rows according to one embodiment of the present invention.
Figure 4:
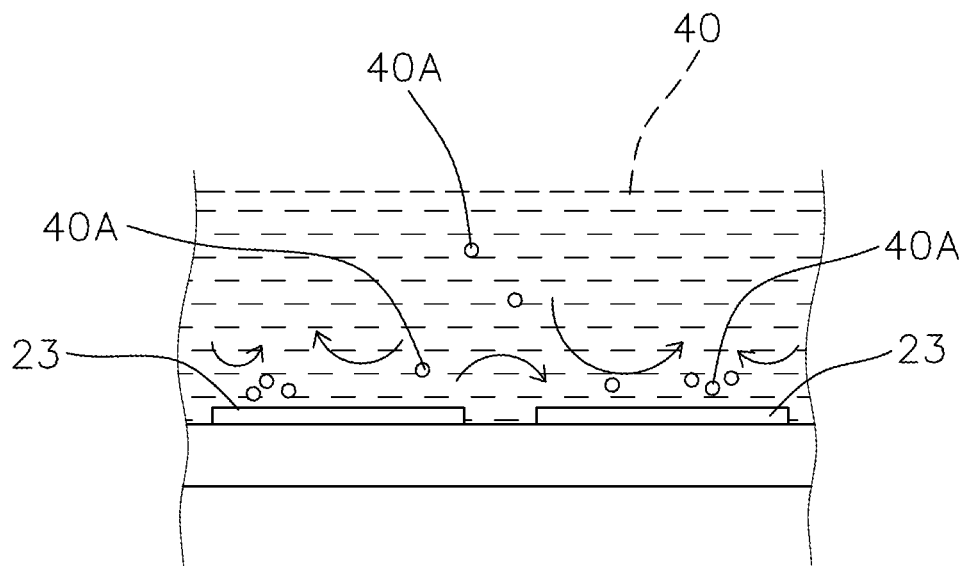
FIG. 4 is a schematic view of driving the polishing particles according to one embodiment of the present invention.

Afterwards, as shown in FIG. 3B, it is a schematic partial view of cavity rows of the polishing pad 20 according to one embodiment of the present invention. A plurality of narrow slots 213 are disposed between the adjacent cavities 211 for allowing electrical connection and fluid communication between the adjacent cavities 211. In one preferred embodiment, the width of each of the narrow slots 213 is less than a width of each of metal bottom portions 23 to improve the characteristics of electrochemical reaction spaces within the cavities 211. Additionally, after the power supply provides the power for the polishing pad 20, the narrow slots 213 between the adjacent cavities 211 is capable of inducing the electro-osmosis effect shown in FIG. 4 and FIG. 5 and the polishing slurry 40 effectively circulates around the main polishing body 21. For example, the polishing particles 40A of the polishing slurry 40 are agitated while the electro-osmosis effect is activated, as shown in FIG. 4.

Figure 7A:
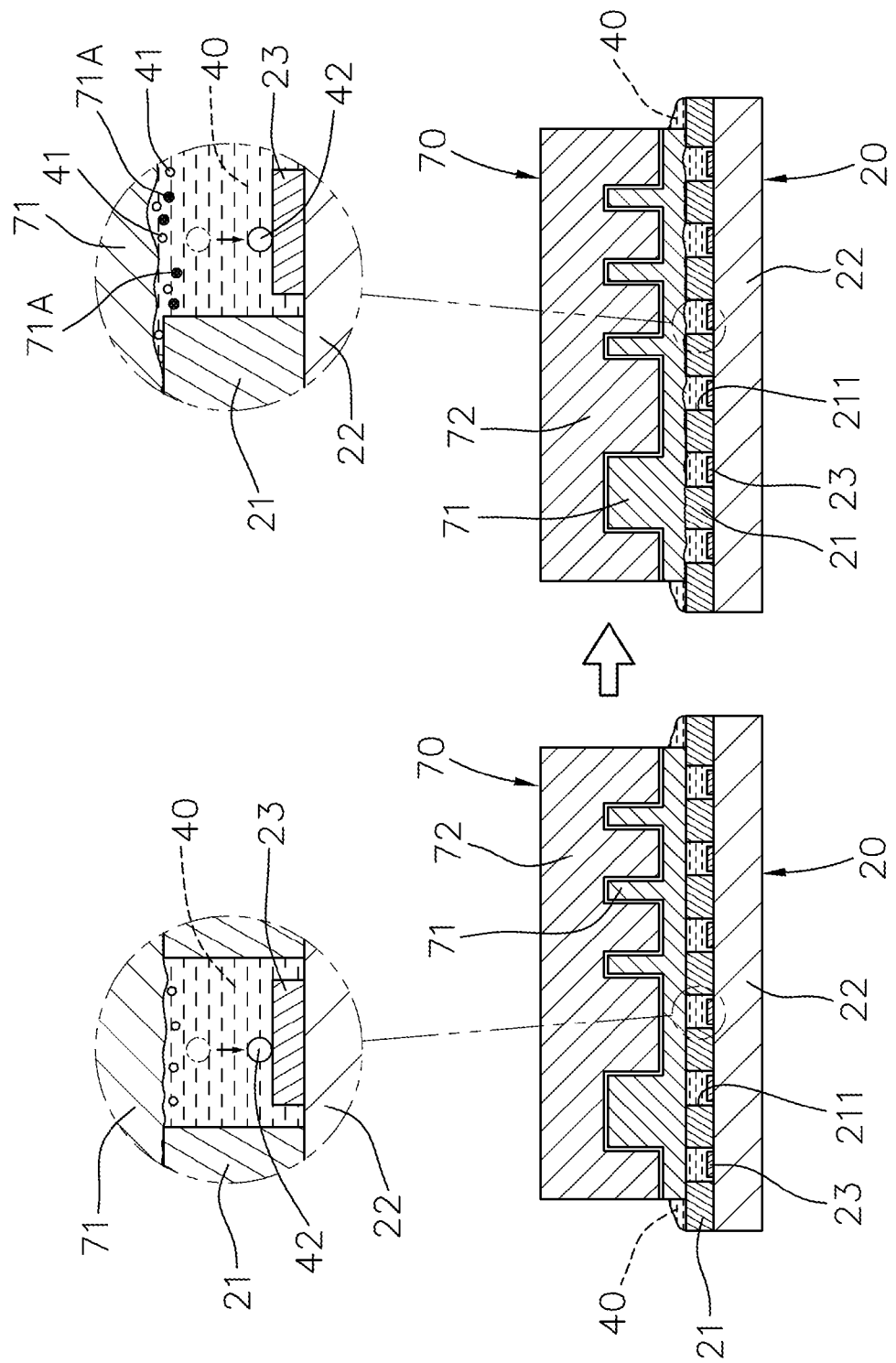
FIG. 7A is a schematic view of an EACMP step in the first process according to one embodiment of the present invention.

Please refer to FIG. 7A. There are small polishing particles 41 and big polishing particles 42. Generally, during the power-off, the big polishing particles 42 fall into the cavities 211 due to gravity and the small polishing particles 41 are disposed between the main polishing body 21 and the predetermined processing layer 71 so that a partial material 71A can be removed advantageously. However, in the conventional polishing step, the big polishing particles and/or big fragments are brought to the position between the main polishing body 21 and the predetermined processing layer 71, which cause the polishing particles with the non-uniform size, scratches and defects disadvantageously, since the disturbance flow of polishing slurry are generated by the conventional polishing step.

The polishing pad 20 of the present invention utilizes a plurality of narrow slots 213 disposed between the adjacent cavities 211 for allowing electrical connection and fluid communication between the metal bottom portions 23 in the arbitrary two adjacent cavities 211. Further, the electro-osmosis effect between the metal bottom portions 23 causes the big polishing particles 40A and/or fragments to be attached to the metal bottom portions 23. In other words, besides the big polishing particles 40A and/or fragments fall into the cavities 211 (shown in FIG. 7A), the big polishing particles 40A and/or fragments are also attached to the metal bottom portions 23 due to the electro-osmosis effect so that the polishing particles 40A of the polishing slurry 40 between the main polishing body 21 and the predetermined processing layer 71 become smaller and uniform. Such the situation can avoid the damage of the surface of the predetermined processing workpiece 70 caused by the big polishing particles 40A and/or fragments.

Figure 2C:
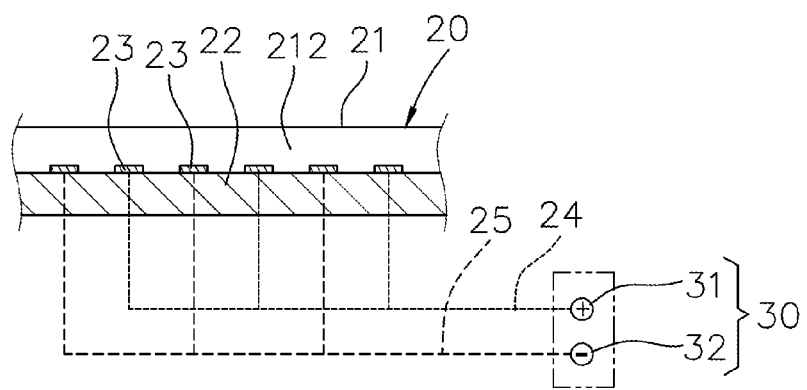
FIG. 2C is a schematic cross-sectional view along the II-II line shown in FIG. 2A according to one embodiment of the present invention.

As shown in FIGS. 2A, 2C and 3A, the polishing pad further includes a plurality of grooves 212 wherein a width of each of the grooves 212 is greater than a width of each of metal bottom portions 23 in FIG. 2C. Each of grooves 212 includes at least two of the metal bottom portions 23. In FIGS. 2C and 3A, the metal bottom portions 23 in the grooves 212 further interlacedly connect to the positive electrode 31 and negative electrode 32, respectively, of the power supply of the EACMP system by the positive electrode conductive wire 24 and negative electrode conductive wire 25 so that the metal bottom portions 23 in the grooves 212 are provided with power to induce electro-osmosis effect. Further, since the width of each of the grooves 212 is greater than the width of each of metal bottom portions 23, the grooves 212 can retain and attach the bigger polishing particles 40A and/or fragments.

Figure 5:
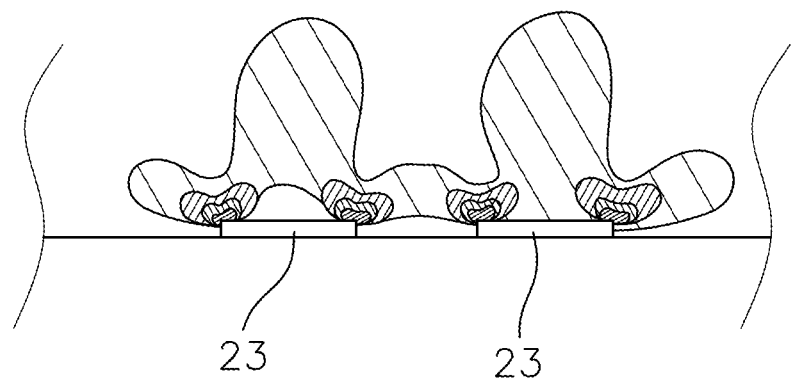
FIG. 5 is a schematic view of electric field intensity according to one embodiment of the present invention.

Please refer to FIG. 5. It is a schematic view of electric field intensity according to one embodiment of the present invention. The more the cross-sectional lines intensive, the more electrical field intensity. In FIG. 5, the cross-sectional lines near the edge of the metal bottom portions 23 are the most intensive after power on and it represents that the edge has the maximum electrical field intensity. In one preferred embodiment, the edge of the metal bottom portions 23 is exposed. That is, the edge position of metal bottom portion 23 does not contact the main polishing body 21 for attaching and rolling the polishing particles 40A and fragments of the polishing slurry 40.

Please refer to FIG. 2A again. In the polishing pad of the present invention, the cavities 211 are substantially arranged in form of a plurality of cavity rows substantially parallel to an extending direction of the grooves 212, and the cavity rows are parallel to and interlaced with the grooves 212 on the polishing pad. Moreover, a plurality of trenches 214 are disposed between the cavities 211 and the grooves 212 for allowing electrical connection and fluid communication between the adjacent cavities 211 and the grooves 212 so that the position between the cavities 211 and the grooves 212 is induced by the electro-osmosis effect. Additionally, a width of each of the trenches 214 is less than a width of each of metal bottom portions 23 for maintaining the characteristics of electrochemical reaction spaces within the cavities 211.

In another embodiment of the present invention, an electrically assisted chemical-mechanical planarization (EACMP) system is described. The EACMP system includes a main base 10, a polishing pad 20, a power supply 30 and a polishing slurry supply unit. The main base 10 has a workpiece retaining portion 11 and a platform 12 wherein a vertical distance between the workpiece retaining portion 11 and the platform 12 can be adjusted. The platform 12 has a driving member 121 for driving the platform 12 to be rotated in view of the polishing pad 20 on the platform 12.

The predetermined processing workpiece 70 includes a predetermined processing layer 71 and a base layer 72 wherein the predetermined processing layer 71 is made from metal material and the base layer 72 is made from oxide material, e.g. silicon. In one case, the predetermined processing workpiece 70 is a semiconductor wafer and the predetermined processing layer 71 is a plurality of connected copper conductive wires before predetermined processing layer 71 is processed. The copper and the oxide material can be spaced apart by tantalum (Ta).

The power supply 30 has the positive electrode 31 and the negative electrode 32, wherein the positive electrode 31 is electrically connected to the positive electrode conductive wire 24 of the polishing pad 20 and the negative electrode 32 is electrically connected to the negative electrode conductive wire 25 of the polishing pad 20 wherein the metal bottom portions 23 form electrodes after power on. FIGS. 2B, 2C and 3A show the interlaced connections of the positive electrode 31 and the negative electrode 32. The adjacent metal bottom portions 23 in the grooves 212 interlacedly connect to the positive electrode 31 and negative electrode 32, respectively and the adjacent metal bottom portions 23 in the cavities 211 interlacedly connect to the positive electrode 31 and negative electrode 32, respectively.

Figure 6:
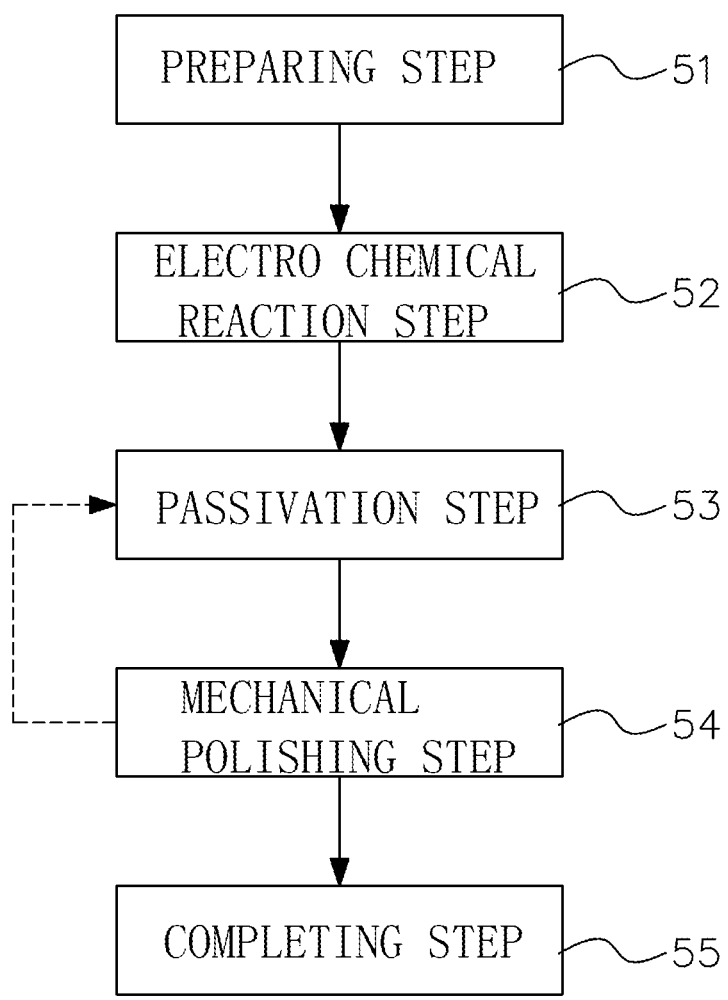
FIG. 6 is a flow chart of an EACMP method according to one embodiment of the present invention.

As shown in FIG. 6, the present invention provides an EACMP method including the following steps.

(1) A preparing step 51 is performed. An EACMP system is prepared and the polishing slurry 40 is distributed to the polishing pad 20.

(2) A step 52 of an electro-osmosis and electrochemical effects are produced.

As shown in FIG. 7A, the predetermined processing layer 71 of the predetermined processing workpiece 70 contacts the main polishing body 21 of the polishing pad 20 so that the predetermined processing layer 71 is dipped in the polishing slurry 40. After the power supply 30 is provided, the electro-osmosis and electrochemical effects are induced so that the position near the edge of the metal bottom portions 23 is agitated by a disturbance flow and the polishing slurry 40 effectively circulates around the main polishing body 21 for removing the partial material of the predetermined processing layer 71.

Figure 7B:
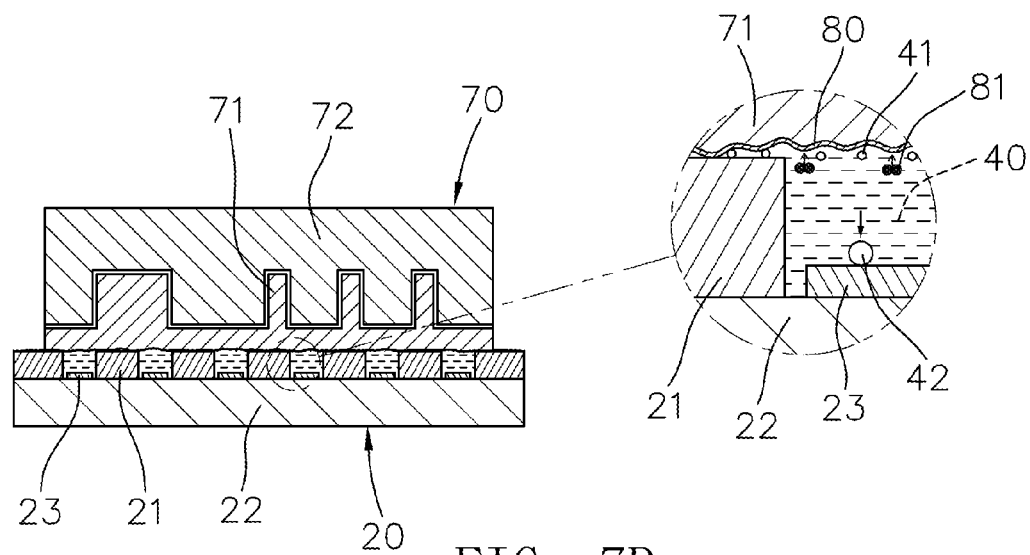
FIG. 7B is a schematic view of an EACMP step in the second process according to one embodiment of the present invention.

(3) A passivating step 53 is performed. When the predetermined processing layer 71 is removed by electrochemical effect, the surface of the predetermined processing layer 71 forms a passivation layer 80. As shown in FIG. 7B, after the metal bottom portions 23 is oxidized, the oxide material 81 gradually forms the passivation layer 80 on the predetermined processing layer 71.

Figure 7C:
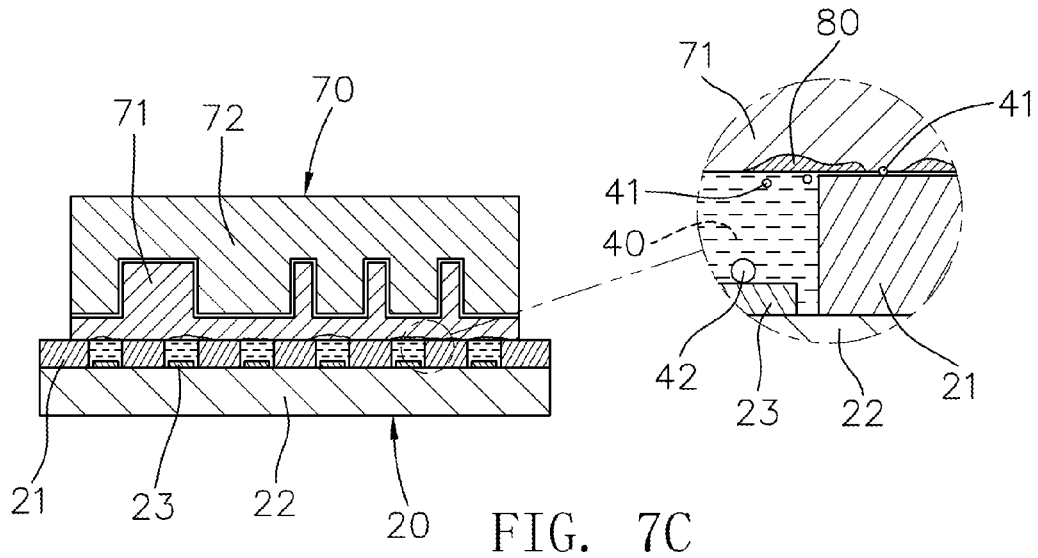
FIG. 7C is a schematic view of an EACMP step in the third process according to one embodiment of the present invention.

(4) A mechanical polishing step 54 is performed. As shown in FIG. 7C, the rotation of the polishing pad 20 drives the circulation of the polishing slurry 40 for mechanically polishing the predetermined processing layer 71 of the formed passivation layer 80.

Figure 7D:
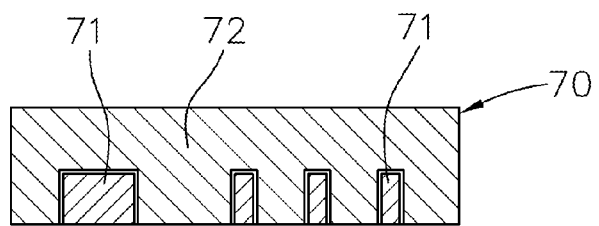
FIG. 7D is a schematic view of an EACMP step in the fourth process according to one embodiment of the present invention.

(5) A complete step. As shown in FIG. 7D, a step 52 of an electro-osmosis and electrochemical effects, a passivating step 53 and a mechanical polishing step 54 are repeated and a polishing end point reaches to planarize the surface of the predetermined processing layer 71.

Figure 8:
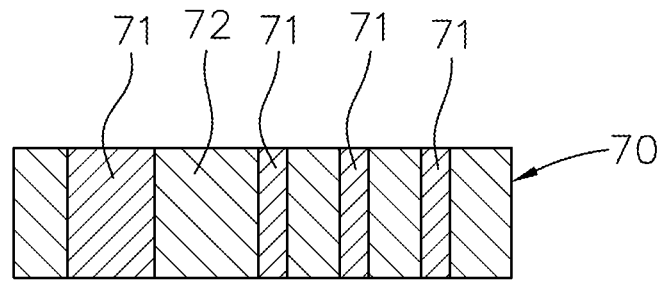
FIG. 8 is a schematic view of a semiconductor wafer according to another embodiment of the present invention.

In FIG. 7D, each of copper wire of the predetermined processing layer 71 is separated and planarized after the predetermined processing layer 71 is processed. In this case, the copper wires do not pass through the predetermined processing workpiece 70. However, in FIG. 8, the copper wires can pass through the predetermined processing workpiece 70 according to another embodiment of the present invention.

Specifically, the components of the polishing slurry 40 include chemical solution, corrosive inhibitor, chelating agent and other additive agents (e.g. suspended particles). The chemical solution corrodes the predetermined processing layer 71 and the corrosive inhibitor, chelating agent and other additive agents of the polishing slurry 40 make a passivation step and a rapid dissolution step. As shown in FIG. 9, during the step 52 of an electro-osmosis and electrochemical effects, the copper ions ($Cu^{2+}$) of the predetermined processing layer 71 are ionized and enter the polishing slurry 40 for increasing the removal rate of the predetermined processing layer 71 while the chemical reaction of the polishing slurry 40 is applied by proper current. Further, due to electric field distribution induced by the electro-osmosis effect, the polishing slurry 40 continuously circulates between the main polishing body 21 and predetermined processing layer 71 for rapidly draining the fragments.

In addition, while the electro-osmosis and electrochemical effects are induced, the cavities 211 connected to the positive electrode 31 is oxidized so that the surface of the predetermined processing layer 71 forms a passivation layer 80 corresponding to the passivating step 53. The passivation layer 80 is capable of protecting the surface of the predetermined processing layer 71 from the chemical dissolution. Further, additive abrasives (e.g. polishing particles in the polishing slurry) and mechanical force (formed by polishing pad 20) are used to remove the passivation layer 80 and the predetermined processing layer 71.

During the processing procedure, the passivating step 53 and mechanical polishing step 54 are repeated and thus, the passivation layer 80 is continuously generated to protect the predetermined processing layer 71 and improves the residual stresses of the predetermined processing layer 71 due to a mechanical polishing operation while the predetermined processing layer 71 is removed.

Figure 10:
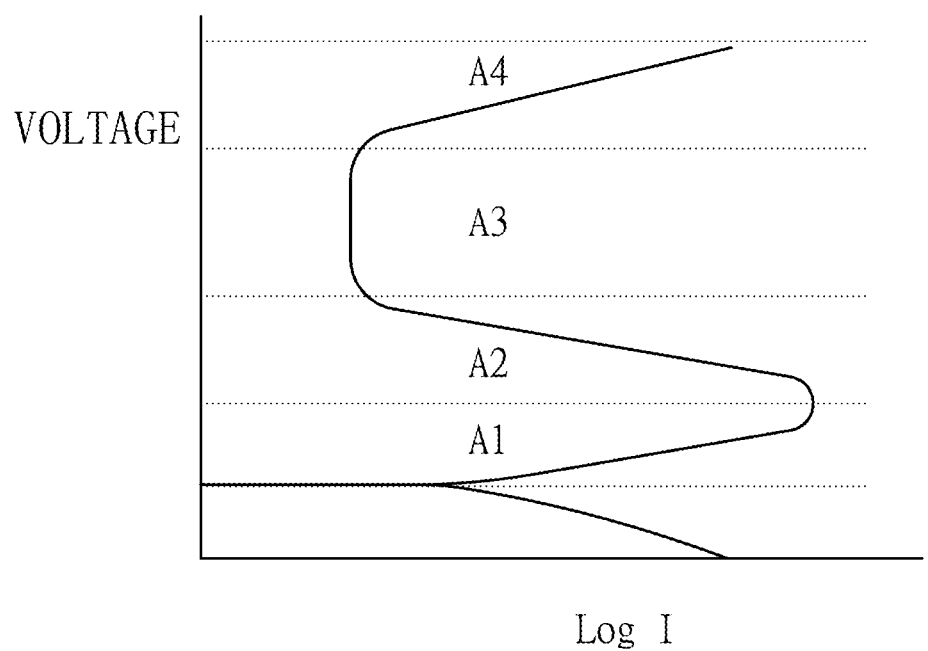
FIG. 10 is a schematic view of metal corrosion profile according to one embodiment of the present invention.
Figure 11:
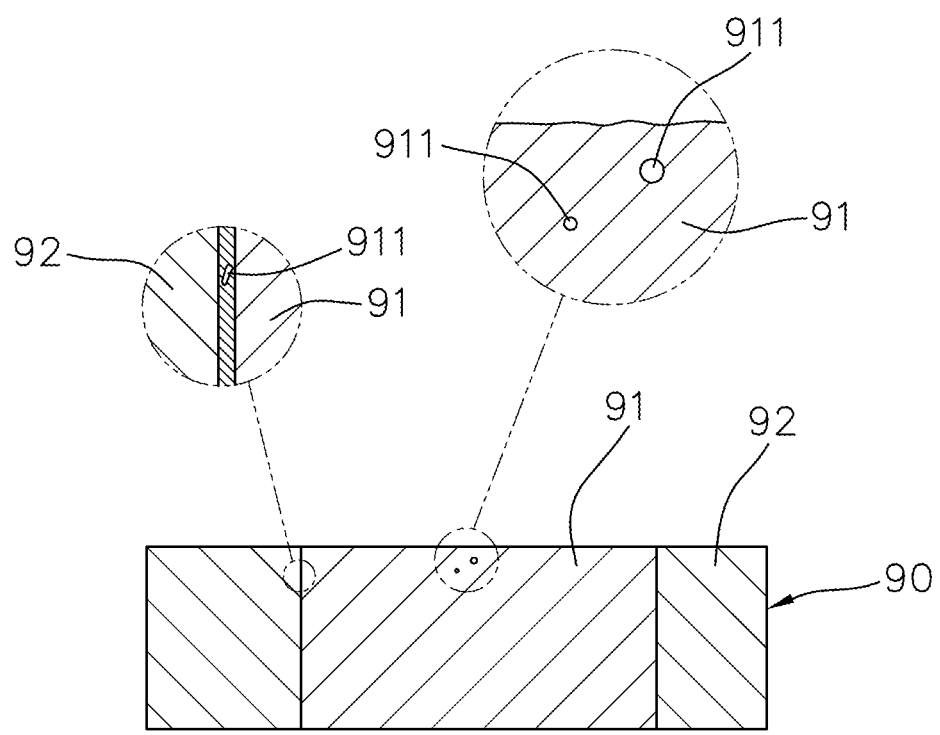
FIG. 11 is a schematic view of a conventional planarization structure after performing a chemical-mechanical polishing method.

As shown in FIG. 10, it is a schematic view of metal corrosion profile according to one embodiment of the present invention. Horizontal axis represents "Log I" and vertical axis represents "VOLTAGE". The first region A1 is an active region where the metal is dissolved. The second region A2 is an active-passive transition region where the surface of the metal forms a passivation layer. The third region A3 is a passive region where the passivation layer covers the surface of the metal and the applied current for corrosion maintains constant. The fourth region A4 is a transpassive region where the passivation layer disintegrates.

Based on the above-mentioned descriptions, the EACMP system and method of the present invention utilizes two removal mechanism including a chemical corrosion and mechanical polishing manners for processing the predetermined processing layer 71 for planarization procedure. Regarding to a conductive design, the manufacturing method is simplified, low-cost and controllable flow of the polishing slurry advantageously. In the present invention, the positive electrode and negative electrode are interlacedly distributed on the polishing pad 20 in form of an embedded electrode manner. It effectively produces an electrochemical effect and an electro-osmosis effect for facilitating the circulation of the polishing slurry 40 and increasing the removal rate of the material. The big polishing particles 40A generated by the polishing slurry 40 are filtered and collected above the electrode (i.e. metal bottom portions 23) of the grooves 212 due to the electro-osmosis effect. Therefore, the sizes of polishing particles 40A are uniform so that the non-uniform polishing particles 40A cannot be embedded into the polishing pad 20 during planarization step and the scratches on the surface of the predetermined processing workpiece 70 are avoided.

According to the aforementioned descriptions, the advantages of the present invention include:

(1) The residual stresses are reduced. It tends to form residual stresses while the CMP process is employed in the multiple layer structure with the copper and low-k (low dielectric constant) materials. However, during the processing step, the passivation layers 80 are continuously generated to protect the predetermined processing layer 71 and reduce the residual stresses of the predetermined processing layer 71 due to mechanical polishing operation.

(2) The defects are decreased effectively. While performing CMP step on the semiconductor wafer, the defects, i.e. holes, are formed when the wafer is damaged due to mechanical processing. During the processing step in the present invention, the passivation layers 80 are continuously generated to protect the predetermined processing layer 71. Meanwhile, due to the electro-osmosis effect, the big polishing particles are collected above the electrode (i.e. metal bottom portions 23) of the grooves 212 so that the polishing particles cannot be circulated between the main polishing body 21 and the predetermined processing layer 71 for reducing the defects.

(3) The removal rate is increased. The present invention utilizes the assisted electric field so that the metal ions of the predetermined processing layer 71 are ionized and enter the polishing slurry 40 for increasing the removal rate of the predetermined processing layer 71.

(4) The sizes of polishing particles maintains uniform. The polishing slurry 40 is effectively circulated due to electro-osmosis effect. Further, the big polishing particles 40A generated by the polishing slurry 40 are filtered and collected above the electrode (i.e. metal bottom portions 23) of the grooves 212 due to the electro-osmosis effect for uniforming the size of polishing particles 40A between the main polishing body 21 and the predetermined processing layer 71. Further, the sizes of polishing particles 40A are uniform so that the non-uniform polishing particles 40A cannot be embedded into the polishing pad 20 during planarization step and the scratches on the surface of the predetermined processing workpiece 70 are avoided.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:
1. A polishing pad, comprising:
a base plate;
a main polishing body, made from a non-conductive material and disposed on a top surface of the base plate, wherein the main polishing body comprises a plurality of cavities thereon;
a plurality of metal bottom portions disposed in the cavities respectively and disposed on the top surface of the base plate wherein each of the cavities comprises one of the metal bottom portions therein, and a plurality of edge positions of the metal bottom portions do not contact the main polishing body respectively and each metal bottom portion does not contact the main polishing body;
a positive electrode conductive wire electrically connected to a positive electrode of a power supply; and a negative electrode conductive wire electrically connected to a negative electrode of the power supply;

wherein the positive electrode conductive wire and the negative electrode conductive wire alternatively pass through the base plate and electrically connect to the metal bottom portions respectively in the cavities.

2. The polishing pad of claim 1, wherein a plurality of narrow slots on the top surface of the base plate are disposed between the adjacent cavities for allowing electrical connection and fluid communication between the adjacent cavities.

3. The polishing pad of claim 2, wherein a width of each of the narrow slots is less than a width of each of metal bottom portions.

4. The polishing pad of claim 3, further comprising a plurality of grooves wherein each of grooves comprises at least two of the metal bottom portions.

5. The polishing pad of claim 4, wherein the cavities are arranged in a plurality of cavity rows substantially parallel to an extending direction of the grooves, and the cavity rows are interlaced with the grooves.

6. The polishing pad of claim 4, wherein a plurality of trenches on the top surface of the base plate are disposed between the cavities and the grooves for allowing electrically connection and fluid communication between the adjacent cavities and the grooves.

7. The polishing pad of claim 6, wherein a width of each of the trenches is less than a width of each of metal bottom portions.

8. The polishing pad of claim 2, further comprising a plurality of grooves wherein each of grooves comprises at least two of the metal bottom portions.

9. The polishing pad of claim 8, wherein a width of each of the narrow slots is less than a width of each of metal bottom portions.

10. The polishing pad of claim 8, wherein the cavities are arranged in a plurality of cavity rows substantially parallel to an extending direction of the grooves, and the cavity rows are interlaced with the grooves.

11. The polishing pad of claim 8, wherein a plurality of trenches on the top surface of the base plate are disposed between the cavities and the grooves for allowing electrically connection and fluid communication between the adjacent cavities and the grooves.

12. The polishing pad of claim 11, wherein a width of each of the trenches is less than a width of each of metal bottom portions.

13. The polishing pad of claim 1, further comprising a plurality of grooves wherein each of grooves comprises at least two of the metal bottom portions.

14. The polishing pad of claim 13, wherein the cavities are arranged in a plurality of cavity rows substantially parallel to an extending direction of the grooves, and the cavity rows are interlaced with the grooves.

15. The polishing pad of claim 13, wherein a plurality of trenches are disposed between the cavities and the grooves for allowing electrical connection and fluid communication between the adjacent cavities and the grooves.

16. The polishing pad of claim 15, wherein a width of each of the trenches is less than a width of each of metal bottom portions.

17. An electrically assisted chemical-mechanical planarization (EACMP) system, comprising:
　　a main base having a workpiece retaining portion and a platform, wherein a vertical distance between the workpiece retaining portion and the platform can be adjusted, and the platform comprises a driving member for driving the platform to be rotatable;
　　a polishing pad described in claim 1 and disposed on the platform;
　　a power supply having the positive electrode and the negative electrode, wherein the positive electrode is electrically connected to the positive electrode conductive wire of the polishing pad and the negative electrode is electrically connected to the negative electrode conductive wire of the polishing pad; and
　　a polishing slurry supply unit, for distributing a polishing slurry to the polishing pad.

18. An electrically assisted chemical-mechanical planarization (EACMP) method comprising the steps of:
　　(1) performing a preparing step by using an electrically assisted chemical-mechanical planarization (EACMP) system described in claim 17 and distributing a polishing slurry to the polishing pad;
　　(2) producing a step of an electro-osmosis effect and an electrochemical effect wherein a predetermined processing layer of a predetermined processing workpiece contacts a main polishing body of the polishing pad for dipping the predetermined processing layer in the polishing slurry, the electro-osmosis and electrochemical effects are induced after providing the power supply for circulating the polishing slurry around the main polishing body for removing partial material of the predetermined processing layer;
　　(3) performing a passivating step, wherein when the predetermined processing layer is removed by electrochemical effect, a surface of the predetermined processing layer forms a passivation layer;
　　(4) performing a mechanical polishing step, wherein the polishing pad is rotated to drive a circulation of the polishing slurry for mechanically polishing the predetermined processing layer of the formed passivation layer; and
　　(5) performing a complete step, wherein an electro-osmosis and electrochemical effects of the step (2), the passivating step of step (3) and the mechanical polishing step of step (4) are repeated for planarizing the surface of the predetermined processing layer.

\* \* \* \* \*